(12) United States Patent
Kuo

(10) Patent No.: US 9,704,841 B2
(45) Date of Patent: Jul. 11, 2017

(54) METHOD OF PACKAGING STACKED DIES ON WAFER USING FLIP-CHIP BONDING

(71) Applicant: UNITED MICROELECTRONICS CORP., Hsin-Chu (TW)

(72) Inventor: Chien-Li Kuo, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/226,802

(22) Filed: Mar. 26, 2014

(65) Prior Publication Data

US 2015/0279829 A1    Oct. 1, 2015

(51) Int. Cl.

| H01L 21/70 | (2006.01) |
|---|---|
| H01L 25/00 | (2006.01) |
| H01L 23/00 | (2006.01) |
| H01L 25/065 | (2006.01) |
| H01L 21/56 | (2006.01) |
| H01L 25/18 | (2006.01) |

(52) U.S. Cl.
CPC .............. *H01L 25/50* (2013.01); *H01L 24/19* (2013.01); *H01L 24/24* (2013.01); *H01L 24/82* (2013.01); *H01L 24/94* (2013.01); *H01L 24/97* (2013.01); *H01L 25/0652* (2013.01); *H01L 21/561* (2013.01); *H01L 25/18* (2013.01); *H01L 2224/04105* (2013.01); *H01L 2224/12105* (2013.01); *H01L 2224/16145* (2013.01); *H01L 2224/16227* (2013.01); *H01L 2224/32145* (2013.01); *H01L 2224/32225* (2013.01); *H01L 2224/73204* (2013.01); *H01L 2224/73209* (2013.01); *H01L 2224/81895* (2013.01); *H01L 2224/8203* (2013.01); *H01L 2224/92124* (2013.01); *H01L 2224/94* (2013.01); *H01L 2224/97* (2013.01); *H01L 2225/06513* (2013.01); *H01L 2225/06517* (2013.01); *H01L 2225/06524* (2013.01); *H01L 2225/06548* (2013.01); *H01L 2225/06586* (2013.01); *H01L 2924/15311* (2013.01)

(58) Field of Classification Search
CPC ....... H01L 2924/00; H01L 2924/00014; H01L 2224/73204; H01L 2224/16225; H01L 2224/97; H01L 2224/32145; H01L 2224/48247; H01L 2224/014
See application file for complete search history.

(56) References Cited

U.S. PATENT DOCUMENTS

| 6,204,562 B1 | 3/2001 | Ho |
|---|---|---|
| 6,765,299 B2 | 7/2004 | Takahashi |

(Continued)

OTHER PUBLICATIONS

Paul Siblerud, Through Silicon Via Technology 3D iTSV™ Integration of High Aspect Ratio Etch and Barrier/Seed with Electroplate Copper, May 2009.

*Primary Examiner* — Allen Parker
*Assistant Examiner* — Wasiul Haider
(74) *Attorney, Agent, or Firm* — Winston Hsu

(57) ABSTRACT

A wafer package process includes the following steps. A wafer with a plurality of first dies is provided. A plurality of second dies are bonded on the first dies by using flip chip technology, wherein the size of the first die is larger than that of the second die. A molding material is formed to entirely cover the second dies and the wafer. A through via is formed in the molding material. A conductive material is formed to fill the through via onto the molding material.

15 Claims, 11 Drawing Sheets

(56) References Cited

U.S. PATENT DOCUMENTS

| | | | |
|---|---|---|---|
| 6,960,826 B2 | 11/2005 | Ho | |
| 7,084,513 B2 | 8/2006 | Matsuki | |
| 7,960,272 B2* | 6/2011 | Lee et al. | 438/613 |
| 8,264,080 B2 | 9/2012 | Pagaila | |
| 8,455,991 B2* | 6/2013 | Hsiao | H01L 21/568 257/678 |
| 2007/0045875 A1* | 3/2007 | Farnworth | H01L 21/568 257/787 |
| 2008/0246126 A1* | 10/2008 | Bowles et al. | 257/659 |
| 2009/0243088 A1* | 10/2009 | Goodrich | H01L 21/76837 257/734 |
| 2009/0321948 A1* | 12/2009 | Wang et al. | 257/777 |
| 2012/0153488 A1* | 6/2012 | Oganesian | H01L 25/0657 257/772 |
| 2012/0193779 A1* | 8/2012 | Lee et al. | 257/737 |
| 2013/0037929 A1* | 2/2013 | Essig | H01L 23/49816 257/693 |
| 2013/0049195 A1* | 2/2013 | Wu | H01L 24/97 257/738 |
| 2013/0049749 A1* | 2/2013 | Mohan | G01R 33/04 324/252 |
| 2013/0105966 A1* | 5/2013 | Kelkar | H01L 24/19 257/737 |
| 2013/0221493 A1* | 8/2013 | Kim | H01L 23/481 257/620 |
| 2013/0273694 A1* | 10/2013 | Hsieh | H01L 23/427 438/113 |
| 2013/0307140 A1* | 11/2013 | Huang | H01L 24/19 257/737 |
| 2013/0320522 A1* | 12/2013 | Lai | H01L 24/05 257/737 |
| 2013/0320523 A1* | 12/2013 | Lee | H01L 24/75 257/737 |
| 2014/0057394 A1* | 2/2014 | Ramasamy et al. | 438/113 |
| 2014/0061932 A1* | 3/2014 | Chen et al. | 257/773 |
| 2014/0168014 A1* | 6/2014 | Chih | H01L 24/19 343/700 MS |
| 2014/0206140 A1* | 7/2014 | Wang | H01L 21/56 438/107 |
| 2014/0252605 A1* | 9/2014 | Ma | H01L 25/50 257/737 |
| 2014/0353775 A1* | 12/2014 | Formosa | B81C 1/00238 257/415 |
| 2014/0367848 A1* | 12/2014 | Chi et al. | 257/737 |
| 2015/0118797 A1* | 4/2015 | Liu | H01L 21/565 438/114 |

\* cited by examiner

METHOD OF PACKAGING STACKED DIES ON WAFER USING FLIP-CHIP BONDING

BACKGROUND OF THE INVENTION

1. Field of the Invention

The present invention relates generally to a wafer package process, and more specifically to a wafer package process which applies flip-chip and molding technology.

2. Description of the Prior Art

As semiconductor fabrication technology grows more advanced, relevant techniques have to be developed in accordance with the changing requirements of the semiconductor devices. The fabrication process of a semiconductor device typically includes three stages. In the first stage, an epitaxy technique may be used for the formation of a semiconductor substrate. Semiconductor devices such as metal-oxide semiconductor (MOS) and multilevel interconnection are fabricated on the substrate in the second stage.

The third stage is the packaging process. It is now a leading trend devices or electronic products to be fabricated of thin, light, and small dimensions; that is, with a higher integration for semiconductor devices. Many package techniques such as chip scale package or multi-chip module (MCM) have been developed to obtain this high integration. The development of a fabrication technique with a line width of 0.18 µm has created great interest, and spurred intensive research to further decrease the package volume. Currently, one of the most important package techniques involves arranging more than one chip into a single package. In a multi-chip package, processor and memory chips, including dynamic random access memory (DRAM) and flash memory chips, can be packed together with a logic circuit into a single package, which reduces both the fabrication cost and the packaging volume. The signal transmission path can also be shortened to enhance the efficiency thereof, and this multi-chip IC packaging technology can be applied to a multi-chip system with variable functions and operation frequencies.

SUMMARY OF THE INVENTION

The present invention provides a wafer package process, which bonds dies by using flip chip technology, packages these dies using a molding material, and then covers a conductive material filled into through vias both in and on the molding material for electrical connecting to external connections and routing circuits, to improve the integration of a formed chip.

The present invention provides a wafer package process including the following step. A wafer with a plurality of first dies is provided. A plurality of second dies are bonded on the first dies by using flip chip technology, wherein the size of the first die is larger than that of the second die. A molding material is formed to entirely cover the second dies and the wafer. A through via is formed in the molding material. A conductive material is formed to fill the through via onto the molding material.

According to the above, the present invention provides a wafer package process, which bonds a second die on a first die by using flip chip technology, forms a molding material to entirely cover the second die and the first die with at least a through via in the molding material, and then forms a conductive material which fills the through via onto the molding material. Thereby, the first die and the second die can be packaged to be a functional chip. By using flip chip technology, the chip including the first die and the second die can have a smaller size and the signal or electricity transmission can be shortened. The first die and the second die can be well-packaged by the molding material. The conductive material which fills the through via for electrically connecting the first die and the second die to external connections, and the conductive material on the molding material for constituting a redistribution layer can thereby be disposed accurately.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
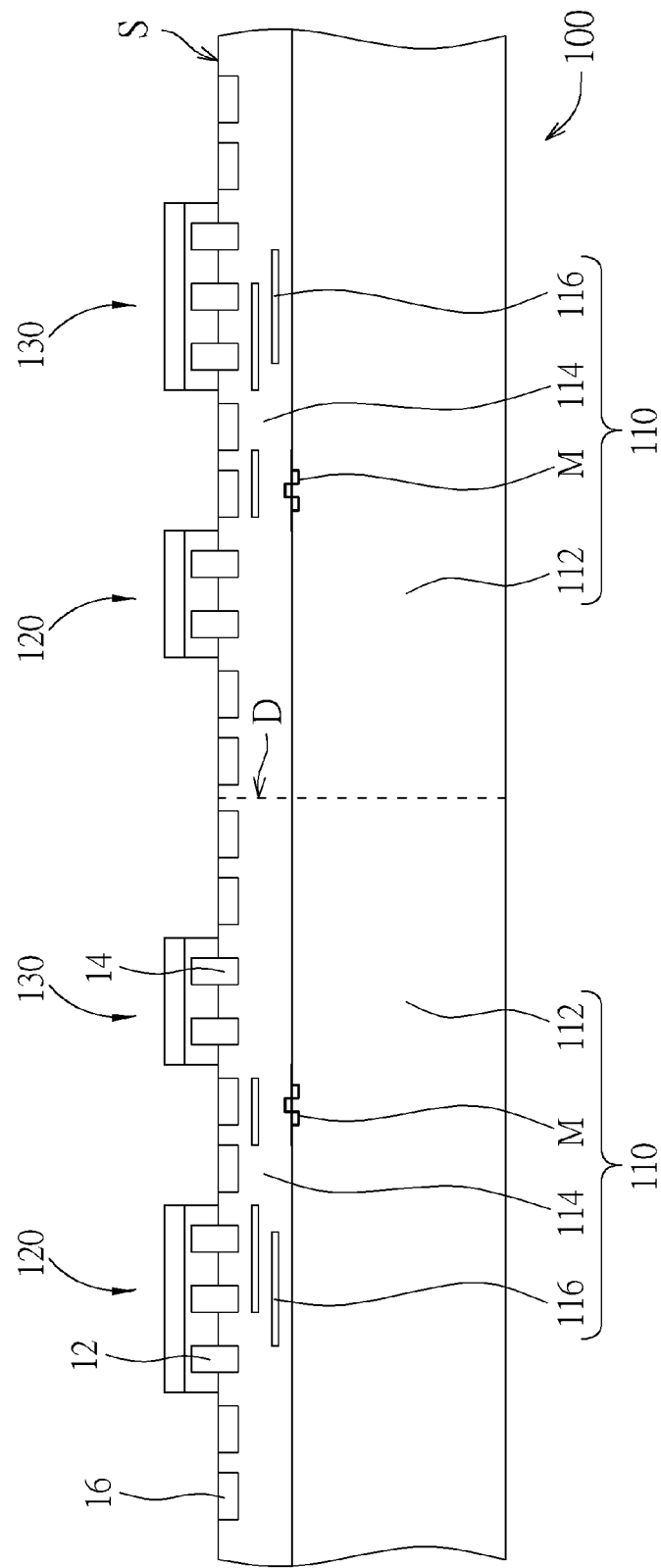
FIGS. 1-9 schematically depict a cross-sectional view of a wafer package process according to an embodiment of the present invention.

FIGS. 1-9 schematically depict a cross-sectional view of a wafer package process according to an embodiment of the present invention. As shown in FIG. 1, a wafer 100 is provided. In this embodiment, the wafer 100 includes a plurality of first dies 110. For clarifying the present invention, only two first dies 110 are depicted in the figures and described in the specification, but the number is not restricted thereto. Each of the first dies 110 may include a substrate 112, a MOS transistor M, an inter-dielectric layer 114 and an interconnection structure 116. The MOS transistor M is formed on the substrate 110. The inter-dielectric layer 114 entirely covers the substrate 110 and the MOS transistor M. The interconnection structure 116 is formed within the inter-dielectric layer 114 for electrically connecting the MOS transistor M to external connections. The first dies 110 may be logic circuit dies, memory dies, capacitor dies, inductor dies, RF dies, or intelligent power dies. Furthermore, a dicing path D may be formed between the first dies 110 for separating the first dies 110, but is not limited thereto.

Second dies 120 are bonded on the first dies 110, respectively, by using flip chip technology for forming smaller chips and thereby shortening the signal or electricity transmission. This means the LRC delay time can be effectively reduced, so that the package provided in the present invention is applicable to high frequency devices. In this embodiment, the first dies 110 are larger than the second dies 120. Third dies 130 may be further bonded on the first dies 110, respectively, by using flip chip technology for forming smaller chips and shortening transmission time, but this is not limited thereto. Preferably, the second dies 120 and the third dies 130 are arranged in a regular cross-hatch pattern, and each second die 120 and each third die 130 is correspondingly bonded to each first die 110. In other embodiments, the second dies 120 and the third dies 130 may be replaced with chips, so that the second dies 120 and the third dies 130 may be packaged before being bonded to the first dies 110.

The second dies 120 and the third dies 130 may be logic circuit dies, memory dies, capacitor dies, or inductor dies, and each second die 120 and third die 130 may also include a substrate, a MOS transistor, an inter-dielectric layer and an interconnection structure, but are not limited thereto. Preferably, the third dies 130 have different functions from the second dies 120, so that each first die 110, second die 120 and third die 130 can constitute a chip with integrated functions. This can depend upon practical needs, however.

The second dies 120 and the third dies 130 are bonded on the first dies 110 through an assembly process. The assembly process may include a Cu to Cu direct bonding process, a micro-bonding (μ-bonding) process or an oxide fusion bonding process, but is not limited thereto. In this embodiment, the second dies 120 are bonded on the first dies 110 through the bond pads 12 and the third dies 130 are bonded on the first dies 110 through the bond pads 14, but it is not limited thereto. The first die 110 may further include pond pads 16 exposing from a top surface S of the first dies 110 for electrically connecting the first dies 110 with other components. Gaps between the first dies 110 and the second dies 120 and gaps between the first dies and the third dies 130 may be optionally filled-in with underfill (not shown) such as a resin. The number, the relative positions and the connections of the first dies 110, the second dies 120 and the third dies 130 are not restricted thereto. This embodiment is merely one example of applying the concept of the present invention.

Figure 2:
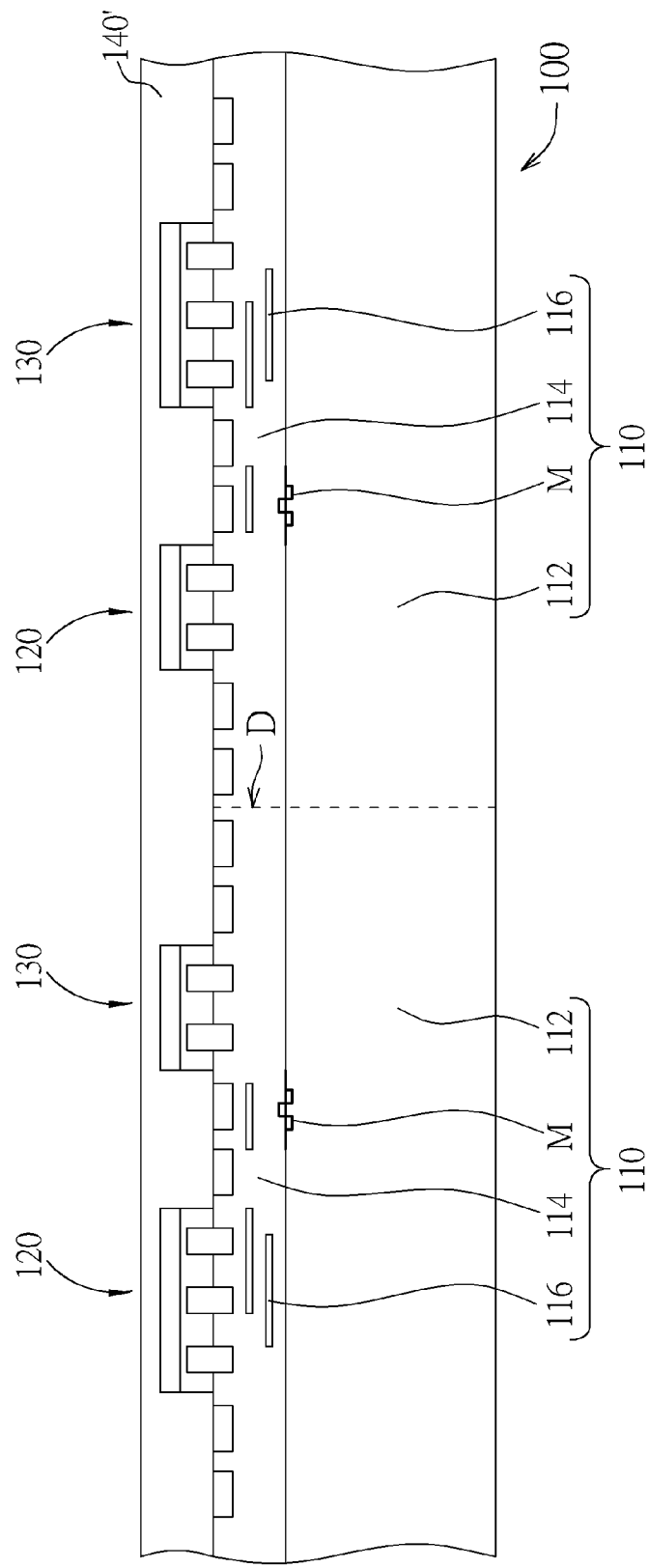
Figure 3:
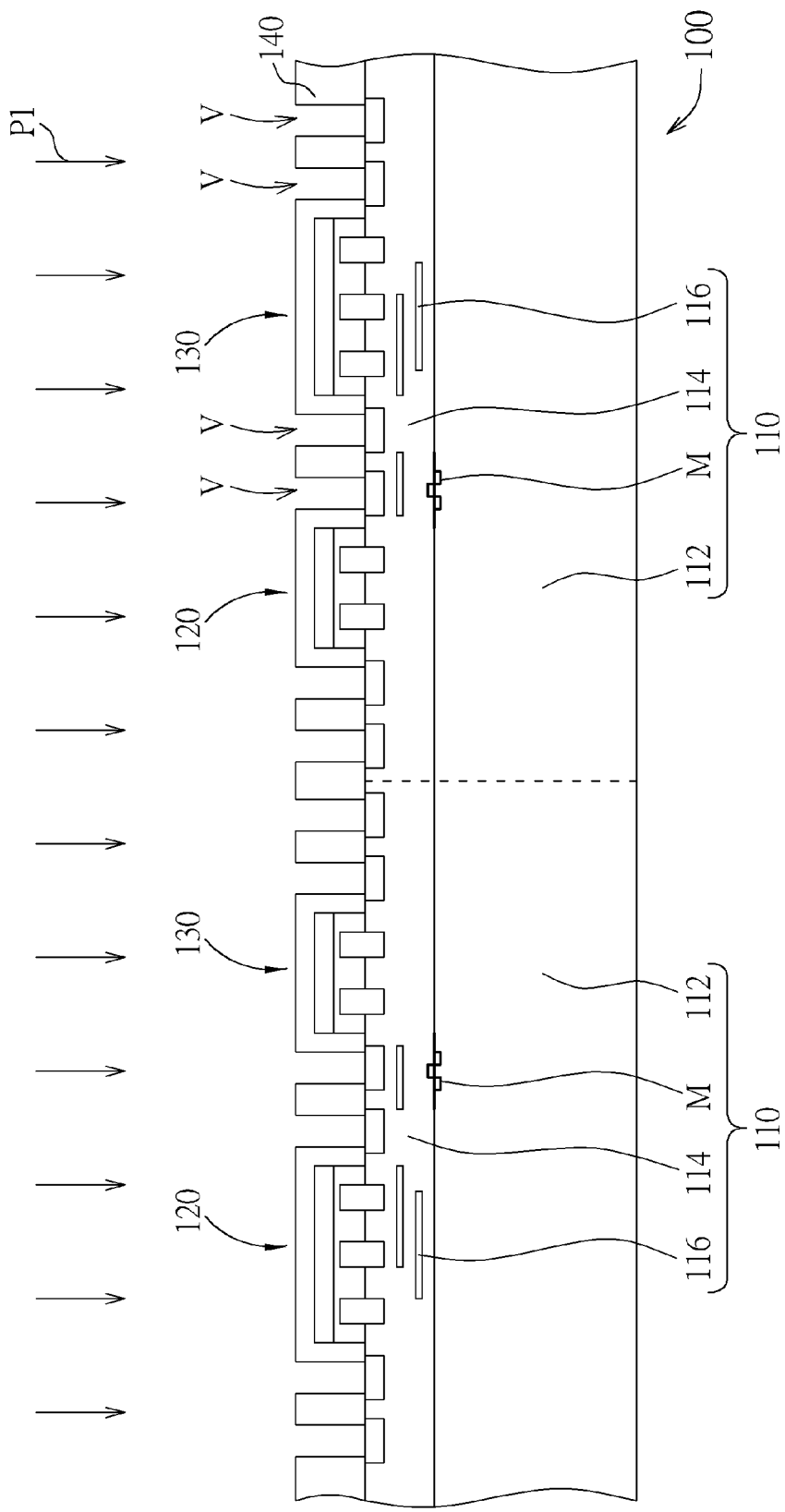

As shown in FIGS. 2-3, a molding material 140 is formed on the first dies 110, the second dies 120 and the third dies 130, and a plurality of through vias V are formed in the molding material 140. More precisely, as shown in FIG. 2, a molding material 140' entirely covers the first dies 110, the second dies 120 and the third dies 130. The molding material 140' may include polymer or benzocyclobutene (BCB) etc., and the molding material 140' may be formed by processes such as coating, injection molding, extruding, but is not limited thereto. A molding material 140' is then patterned to form through vias V therein, to thereby form the molding material 140, as shown in FIG. 3. The molding material 140' may be patterned by a photolithography process and an etching process, but is not limited thereto. The number of the through vias V may be one or more than one, depending upon requirements.

Thereafter, a treatment process P1 may be performed on the molding material 140 for further improving the properties of the molding material 140 suitable for packaging these dies to constitute a functional chip. Preferably, the treatment process P1 is a curing process, applied for solidifying the molding material 140, but is not limited thereto.

Figure 4:
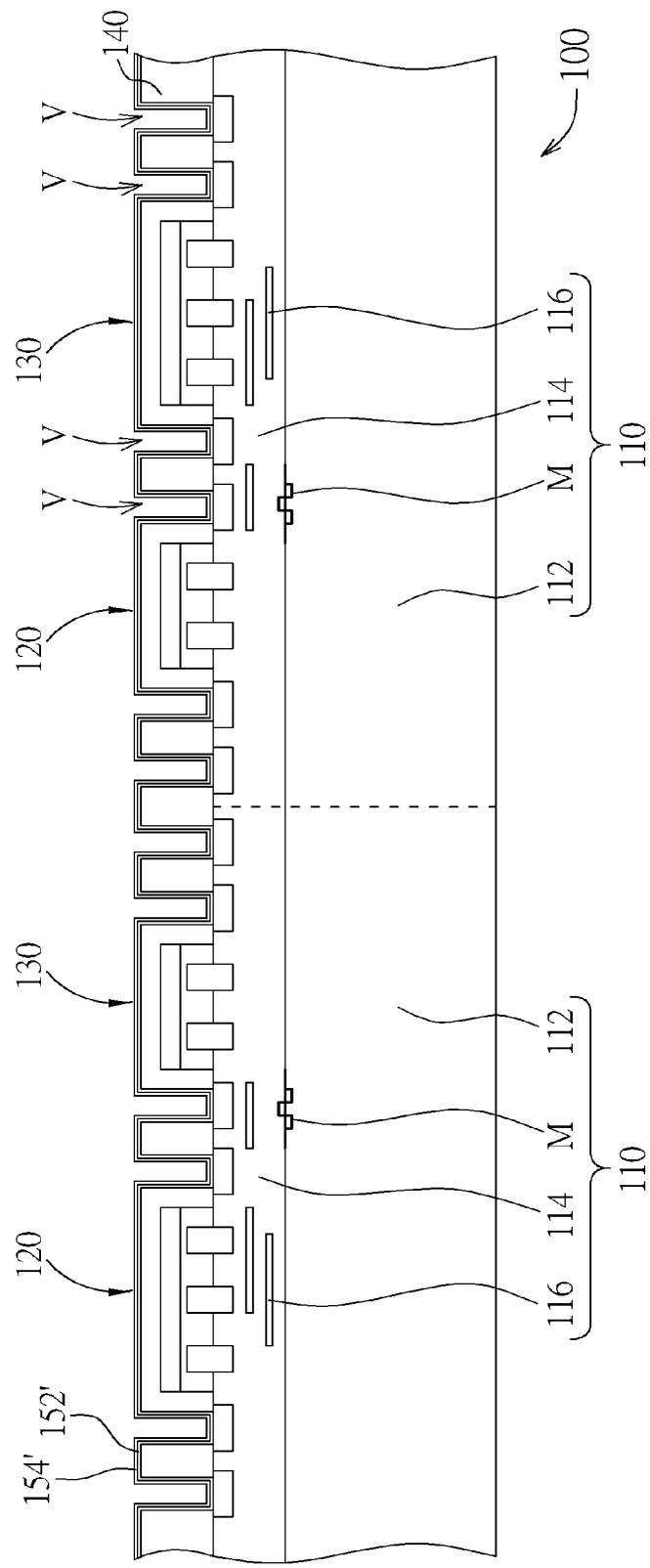
Figure 5:
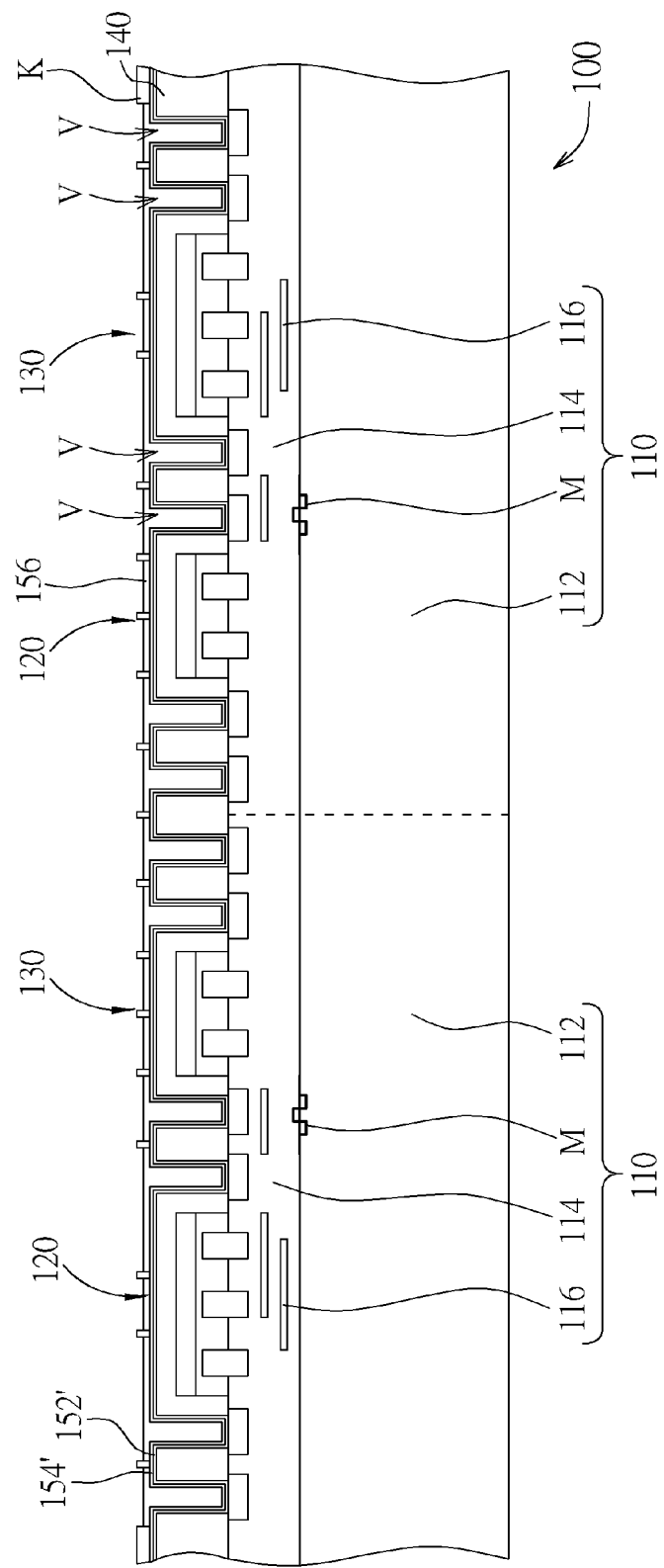
Figure 6:
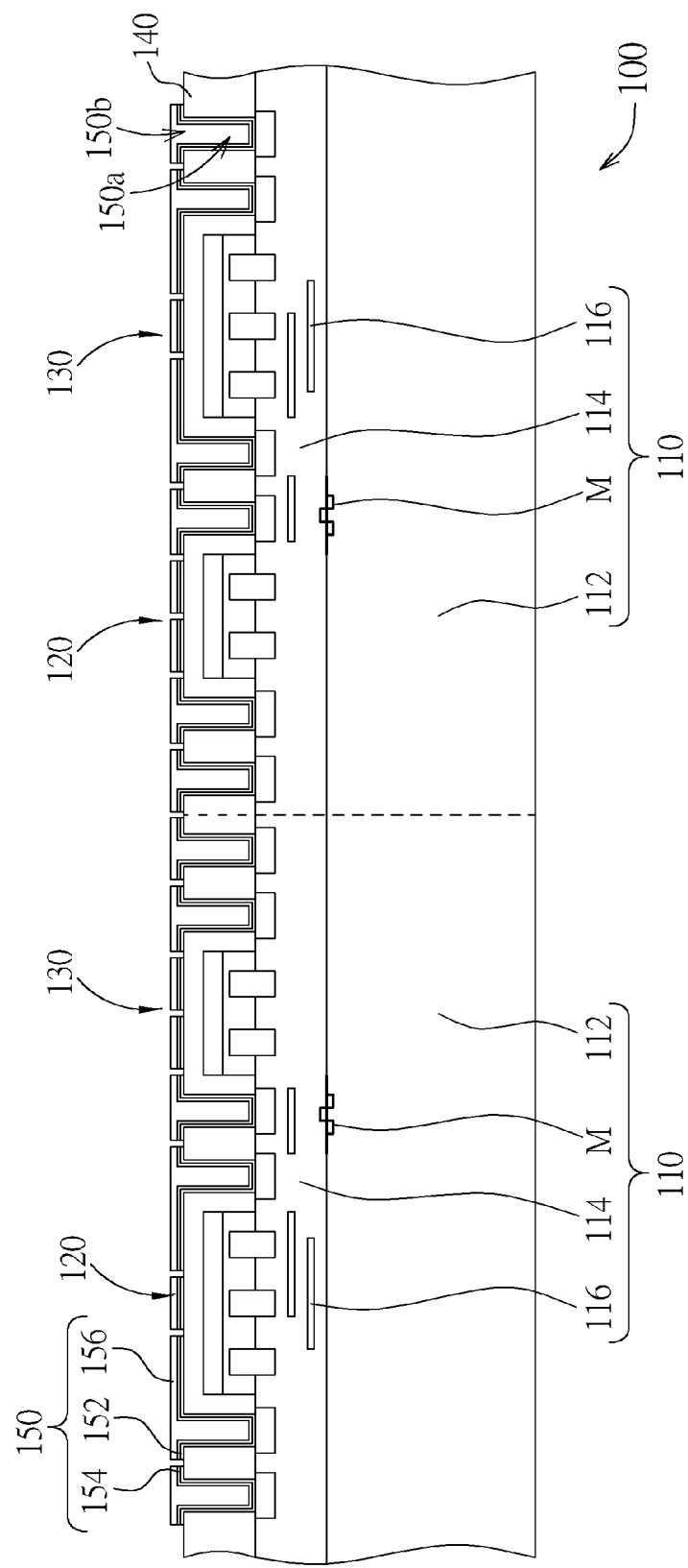

As shown in FIGS. 4-6, a conductive material 150 is formed to fill the through vias V onto the molding material 140. The conductive material 150 may include a patterned barrier layer 152, a patterned seed layer 154 and a patterned main conductive material 156.

In one case, the process of forming the conductive material 150 may include the following steps. As shown in FIG. 4, a barrier layer 152' and a seed layer 154' are sequentially formed to blanketly cover the molding material 140 with through vias V. The barrier layer 152' may be a single layer or a multilayer structure composed of titanium (Ti), tantalum (Ta), tantalum nitride (TaN) or titanium nitride (TiN) etc, formed by a physical vapor deposition (PVD) process or a chemical vapor deposition (CVD); the seed layer 154' may be composed of a metal such as copper, and formed by a physical vapor deposition (PVD) process or a plating process, but this is not limited thereto.

As shown in FIG. 5, a photosensitive layer (not shown) or a solder mask (not shown) may be formed and patterned to form a patterned mask layer K on the barrier layer 152' and the seed layer 154'. In this embodiment, the mask layer K is a photoresist layer, but is not limited thereto. Thereafter, the patterned main conductive material 156 fills the through vias V and openings within the patterned mask layer K. The patterned main conductive material 156 may be composed of metals such as copper, and may be formed by electroplating, but is not limited thereto.

The patterned mask layer K is then removed. The barrier layer 152' and the seed layer 154' exposed by the patterned main conductive material 156 (which was previously covered by the patterned photosensitive layer K) are removed by methods such as etching using the patterned main conductive material 156 as a hard mask. The patterned barrier layer 152, the patterned seed layer 154 and the patterned main conductive material 156 are formed at this point, as shown in FIG. 6.

Figure 10:
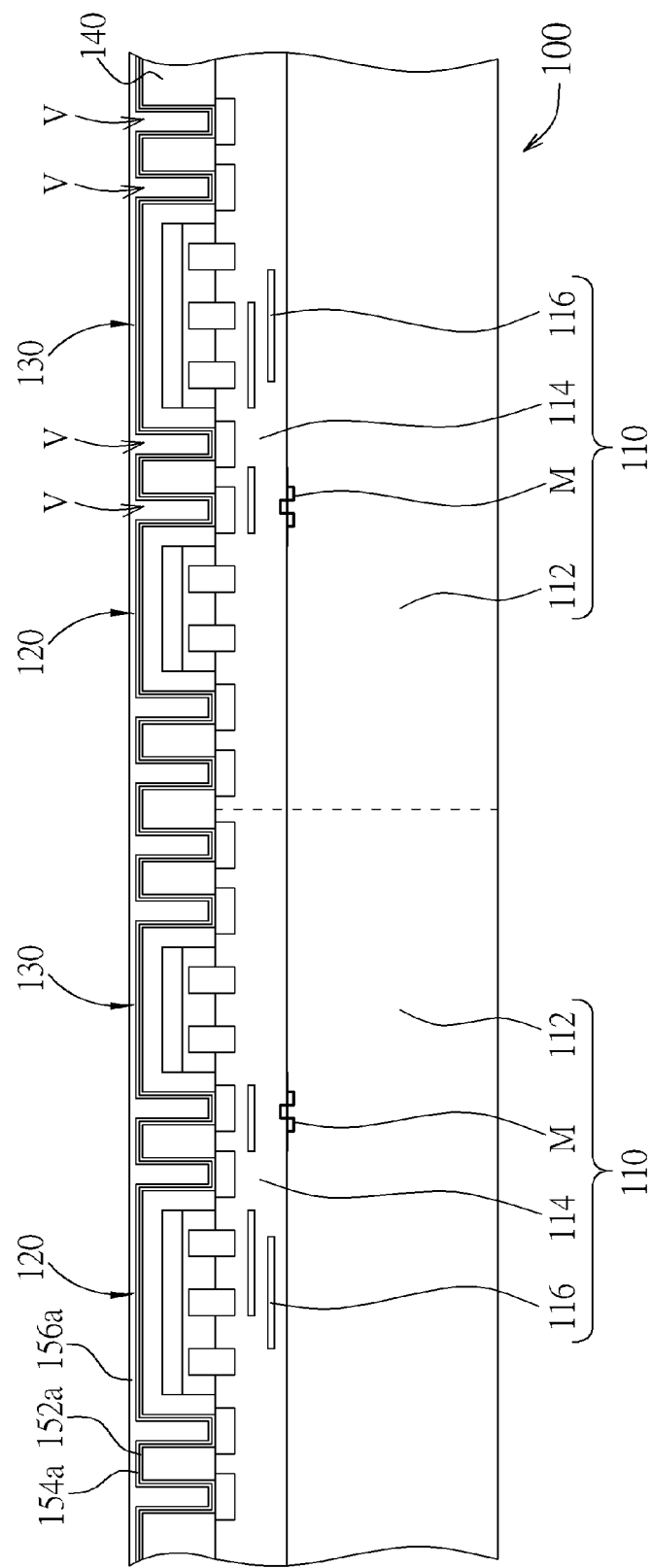
FIGS. 10-11 schematically depict a cross-sectional view of a wafer package process according to another embodiment of the present invention.
Figure 11:
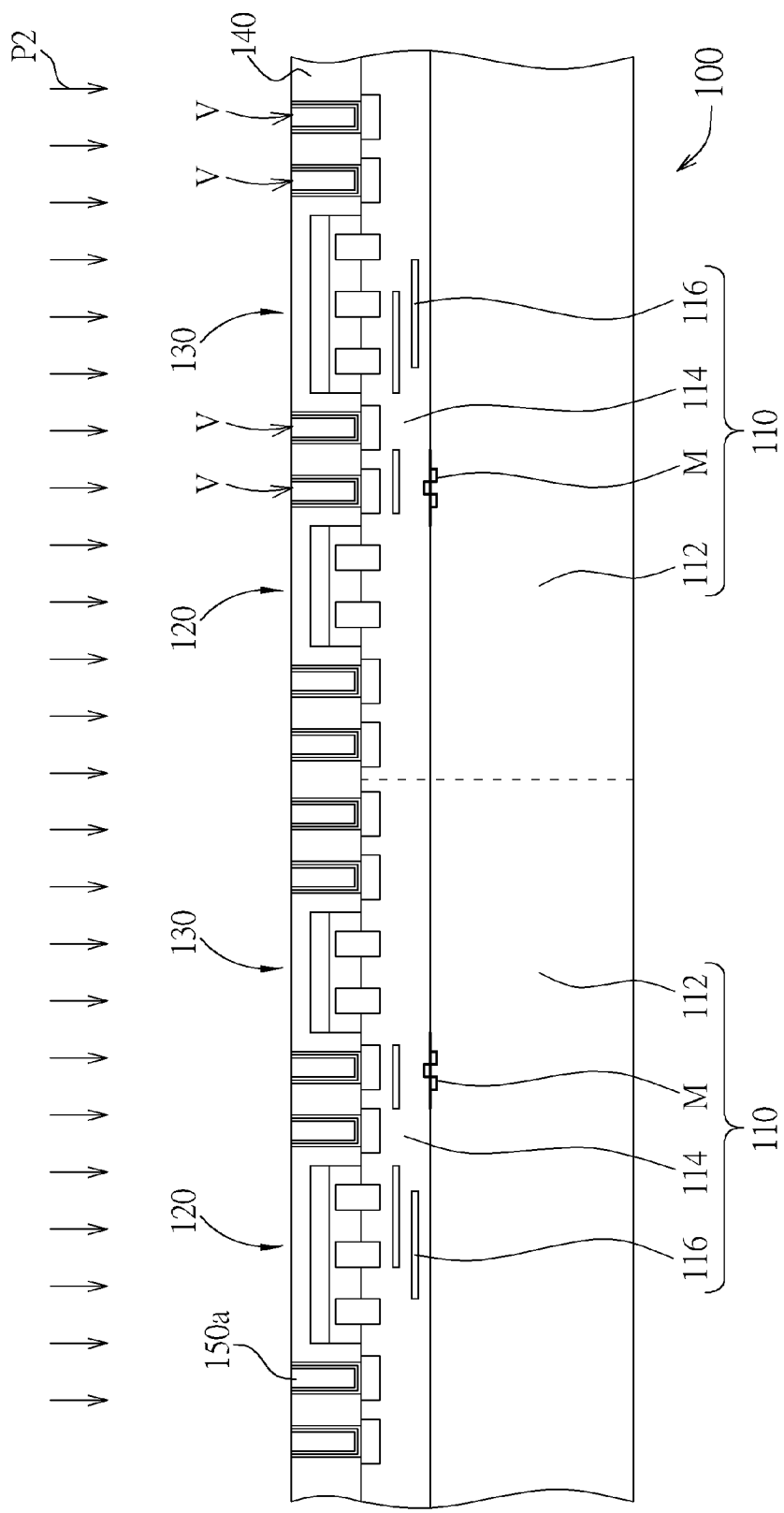

In another case, the process of forming the conductive material 150 may include the following steps. FIGS. 10-11 schematically depict a cross-sectional view of a wafer package process according to another embodiment of the present invention.

As shown in FIG. 10, a barrier layer 152a, a seed layer 154a and a main conductive material 156a are sequentially formed to cover the molding material 140 with through vias V. Then, a planarization process P2 is performed to planarize the main conductive material 156a, the seed layer 154a and the barrier layer 152a until the molding material 140 is exposed. The conductive material 150a which fills the through vias V is formed, as shown in FIG. 11. The conductive material 150b on the molding material 140 is formed, thereby forming the structure of FIG. 6. The conductive material 150a filling the through vias V is used for electrically connecting the first dies 110, the second dies 120 and the third dies 130 to external connections. The conductive material 150b on the molding material 140 can constitute a redistribution layer for routing circuits.

Figure 7:
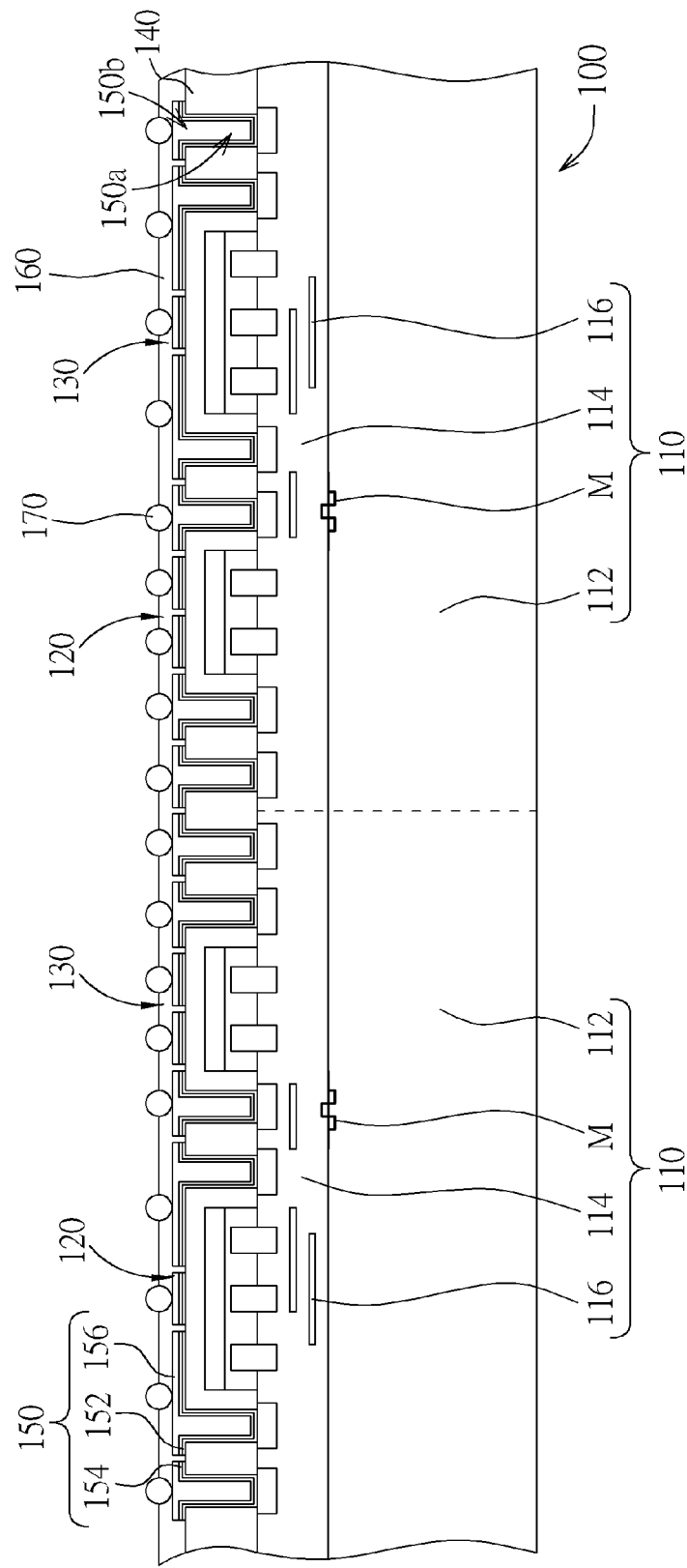

As shown in FIG. 7, a passivation layer 160 may optionally cover the first dies 110, the second dies 120, the third dies 130 and the conductive material 150 for preventing the first dies 110, the second dies 120, the third dies 130 and the conductive material 150 from being exposed to the air. The passivation layer 160 may be composed of polymer, but is not limited thereto. A plurality of bumps 170 are then formed on the conductive material 150, so that the first dies 110, the second dies 120 and the third dies 130 can be electrically connected to external connections. The bumps 170 may be solder balls or conductors of other shapes. The number of the bumps 170 is not restricted to FIG. 7, and can depend upon practical requirements.

Figure 8:
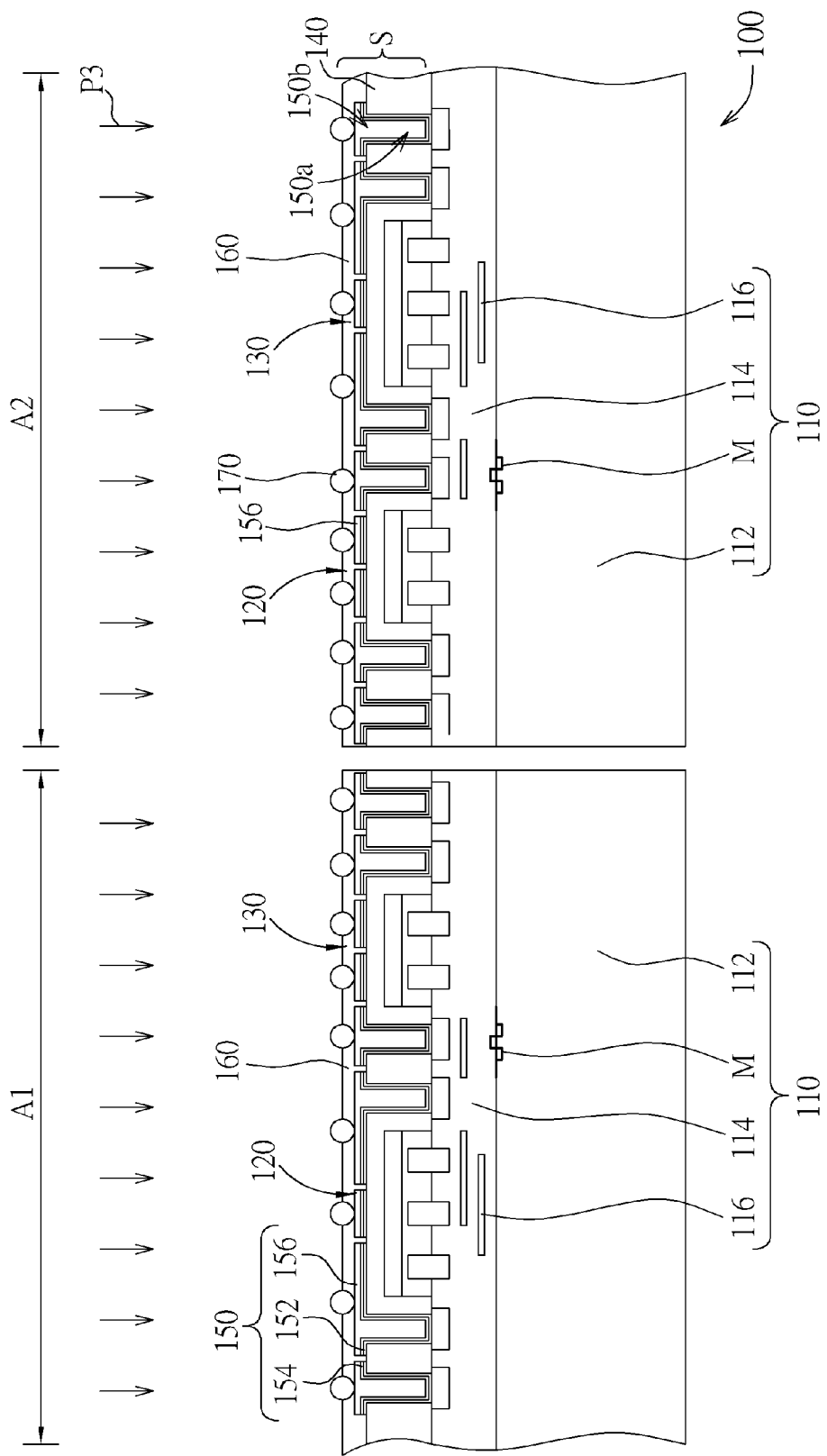

As shown in FIG. 8, a die sawing process P3 may be performed to separate the wafer 100 into many parts A1, A2. In this embodiment, the die sawing process P3 separates the wafer 100 and the structure S thereon into two same parts A1, A2, wherein each part A1, A2 has one of the first dies 110 paired with one of the second dies 120 and one of the third dies 130, but is not limited thereto. The two same parts A1, A2 individually constitute functional chips.

As shown in FIGS. 7-8, the bumps 170 are formed on the conductive material 150, and then the die sawing process P3 is performed. In another embodiment, however, the die sawing process P3 may be performed, and then the bumps 170 are formed on the conductive material 150, depending upon requirements.

Figure 9:
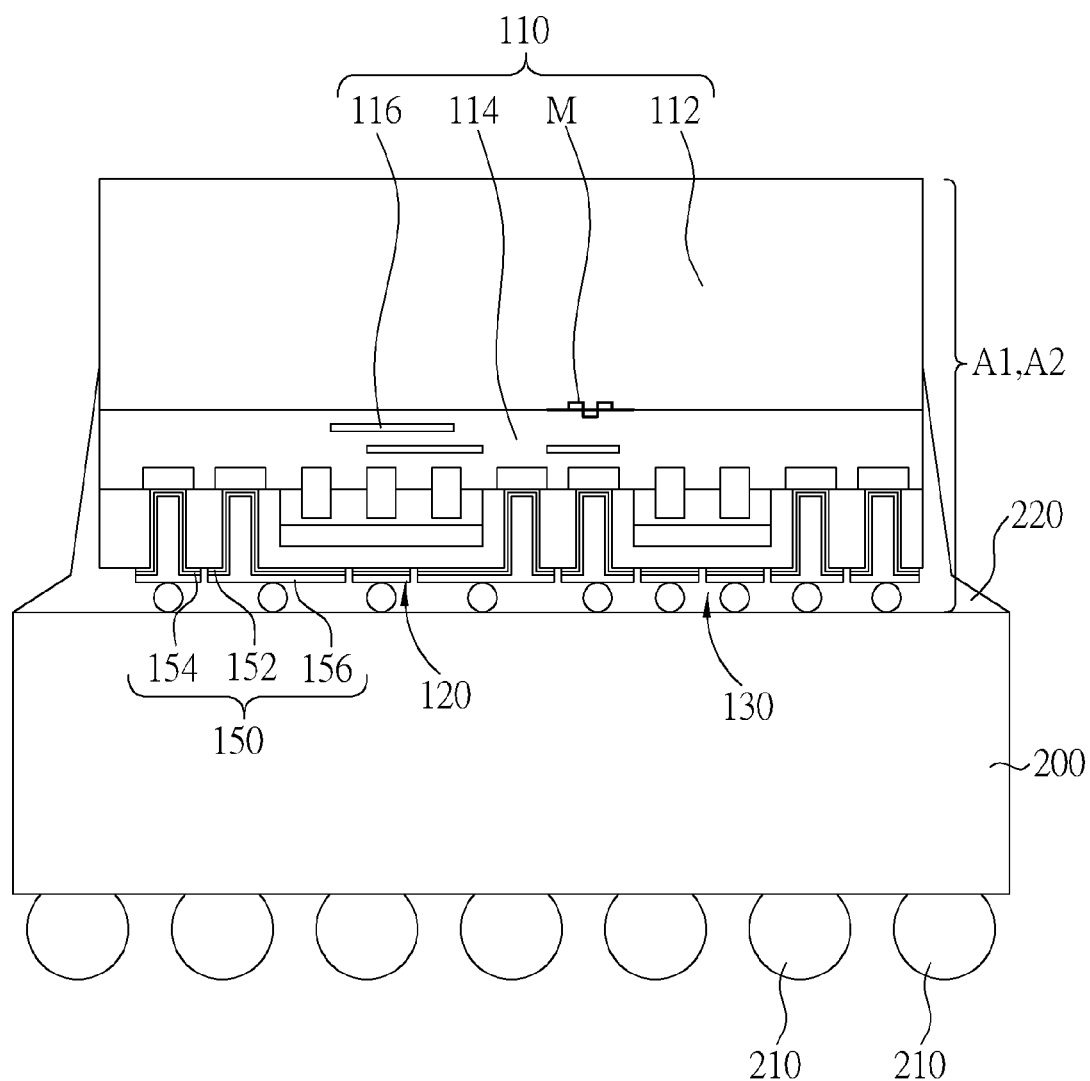

As shown in FIG. 9, one of the parts A1, A2 may be inversely disposed and bonded on a carrier 200 by using flip chip technology. Glue 220 such as resin may optionally fill in space between the parts A1, A2 and the carrier 200. The carrier 200 may be a PCB (printed circuit board), lead frame, chip, a loading plate, a substrate, or wafer. Furthermore, the carrier 200 may be attached with bumps 210 such as solder balls, which act as a terminal to electrically connect another device or circuit. This is not limited thereto.

To summarize, the present invention provides a wafer package process, which bonds a second die on a first die by using flip chip technology, forms a molding material to entirely cover the second die and the first die with at least a through via in the molding material, and then forms a conductive material filling the through via onto the molding material. The first die and the second die can thereby be packaged to form a functional chip. By using flip chip technology, the chip including the first die and the second die can have a smaller size and the signal or electricity transmission can be shortened. The first die and the second die can be well-packaged by the molding material, and the conductive material filled into the through via for electrically connecting the first die and the second die to external connections. In this way, the conductive material on the molding material for constituting a redistribution layer can be disposed accurately.

Moreover, the size of the first die is larger than the size of the second die, so that other devices such as a third die can be further bonded on the first die. The first die is included in a wafer or a substrate, so that a die sawing process may be performed to separate the wafer into many parts after the conductive material is formed.

For instance, the wafer may include a plurality of first dies, second dies and third dies. The second dies and the third dies are arranged regularly in a cross hatch pattern, and each second die and each third die is correspondingly bonded to each first die. Then, a die sawing process may be performed to separate the wafer into many parts, each having one first die paired with one second die and one third die, but this is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer package process, comprising:
   providing a wafer with a plurality of first dies comprising at least a bond pad and an inter-dielectric layer, wherein a MOS transistor is in the inter-dielectric layer;
   bonding a plurality of second dies on the first dies by using flip chip technology, wherein the size of the first die is larger than that of the second die;
   forming a molding material to entirely cover the second dies and the wafer;
   forming a through via only in the molding material and exposing the bond pad, wherein a top surface of the bond pad trims a top surface of the inter-dielectric layer;
   forming a conductive material filling the through via as well as onto the molding material, wherein the step of forming the conductive material comprises: sequentially forming a barrier layer, a seed layer and a main conductive material on the molding material; performing a planarization process to planarize the main conductive material, the seed layer and the barrier layer until the molding material is exposed; and forming additional conductive material on the molding material; and
   performing a sawing process to separate the wafer into many parts after the conductive material is formed.

2. The wafer package process according to claim 1, wherein the molding material comprises polymer or benzocyclobutene (BCB).

3. The wafer package process according to claim 1, wherein the molding material is formed by coating, injection molding or extrusion.

4. The wafer package process according to claim 1, wherein the step of forming the through via in the molding material comprises:
   forming the through via in the molding material using a photolithography process and an etching process.

5. The wafer package process according to claim 4, further comprising:
   performing a curing process on the molding material after the through via is formed.

6. The wafer package process according to claim 1, wherein the conductive material on the molding material comprises a redistribution layer.

7. The wafer package process according to claim 1, further comprising:
   forming a passivation layer entirely covering the first die and the second die after the conductive material is formed.

8. The wafer package process according to claim 1, further comprising:
   forming at least a bump on the conductive material after the conductive material is formed.

9. The wafer package process according to claim 1, further comprising:
   bonding these parts on carriers, respectively, by using flip chip technology.

10. The wafer package process according to claim 1, further comprising:
    bonding a plurality of third dies on the plurality of first dies by using flip chip technology.

11. The wafer package process according to claim 10, wherein the second dies and the third dies are different functional dies.

12. The wafer package process according to claim 10, wherein the second dies and the third dies are bonded on the first dies through an assembly process.

13. The wafer package process according to claim 12, wherein the assembly process comprises a Cu to Cu bonding process, a micro-bonding process or an oxide fusion bonding process.

14. The wafer package process according to claim 10, wherein the second dies and the third dies are arranged regularly and alternately, and each second die and each third die is correspondingly bonded to each first die.

15. The wafer package process according to claim 14, further comprising:
    performing a sawing process to separate the wafer into many parts after the conductive material is formed, wherein each part has one of the first dies paired with one of the second dies and one of the third dies.

* * * * *